United States Patent
La Rosa et al.

(10) Patent No.: US 9,984,770 B2
(45) Date of Patent: May 29, 2018

(54) METHOD FOR MANAGING A FAIL BIT LINE OF A MEMORY PLANE OF A NON VOLATILE MEMORY AND CORRESPONDING MEMORY DEVICE

(71) Applicant: STMicroelectronics (Rousset) SAS, Rousset (FR)

(72) Inventors: Francesco La Rosa, Rousset (FR); Gineuve Alieri, Trapani (IT)

(73) Assignee: STMicroelectronics (Rousset) SAS, Rousset (FR)

( * ) Notice: Subject to any disclaimer, the term of this patent is extended or adjusted under 35 U.S.C. 154(b) by 70 days.

(21) Appl. No.: 15/140,997

(22) Filed: Apr. 28, 2016

(65) Prior Publication Data
US 2017/0163291 A1    Jun. 8, 2017

(30) Foreign Application Priority Data
Dec. 2, 2015  (FR) ..................... 15 61729

(51) Int. Cl.
| | |
|---|---|
| G11C 29/00 | (2006.01) |
| G11C 29/52 | (2006.01) |
| G06F 11/10 | (2006.01) |
| H03M 13/29 | (2006.01) |
| G11C 29/04 | (2006.01) |

(52) U.S. Cl.
CPC .......... *G11C 29/52* (2013.01); *G06F 11/1068* (2013.01); *G11C 29/72* (2013.01); *G11C 29/76* (2013.01); *G11C 29/82* (2013.01); *H03M 13/2906* (2013.01); *G11C 2029/0409* (2013.01)

(58) Field of Classification Search
CPC ..... G06F 11/1068; G11C 29/52; G11C 29/72; G11C 29/76; G11C 29/82; G11C 2029/0409; H03M 13/2906
USPC ................... 714/758, 763, 710, 770
See application file for complete search history.

(56) References Cited

U.S. PATENT DOCUMENTS

| | | | | |
|---|---|---|---|---|
| 4,175,692 A | * | 11/1979 | Watanabe | G06F 11/1024 714/15 |
| 4,319,357 A | * | 3/1982 | Bossen | G06F 11/1048 714/753 |
| 4,475,194 A | * | 10/1984 | LaVallee | G11C 29/76 365/200 |
| 4,740,968 A | | 4/1988 | Aichelmann, Jr. | |
| 4,870,470 A | * | 9/1989 | Bass, Jr. | G11C 16/0466 257/324 |
| 5,132,928 A | * | 7/1992 | Hayashikoshi | G06F 11/1008 365/185.09 |

(Continued)

FOREIGN PATENT DOCUMENTS

FR    2964483 A1    3/2012

Primary Examiner — Albert Decady
Assistant Examiner — Osman M Alshack
(74) Attorney, Agent, or Firm — Slater Matsil, LLP

(57) ABSTRACT

A method can be used for managing the operation of a non-volatile memory equipped with a system for correction of a single error and for detection of a double error. In the case of the detection of a defective bit line of the memory plane, a redundant bit line is assigned and the values of the bits of the memory cells of the defective line are copied into the memory cells of the redundant line and are inverted in the case of the detection of double errors by the system, or corrected by the system in the presence of single errors.

16 Claims, 3 Drawing Sheets

(56) References Cited

U.S. PATENT DOCUMENTS

| | | | |
|---|---|---|---|
| 5,134,616 A * | 7/1992 | Barth, Jr. | G06F 11/1008 |
| | | | 714/710 |
| 7,355,908 B2 | 4/2008 | De Ambroggi et al. | |
| 9,432,298 B1 * | 8/2016 | Smith | H04L 49/9057 |
| 2003/0204795 A1 * | 10/2003 | Adams | G11C 29/14 |
| | | | 714/718 |
| 2006/0018159 A1 | 1/2006 | Picca et al. | |
| 2006/0039196 A1 | 2/2006 | Gorobets et al. | |
| 2006/0136800 A1 * | 6/2006 | Kawabata | G06F 11/1012 |
| | | | 714/763 |
| 2011/0099451 A1 * | 4/2011 | Wezelenburg | G06F 11/1048 |
| | | | 714/755 |
| 2011/0289381 A1 * | 11/2011 | Daga | G06F 11/1044 |
| | | | 714/763 |
| 2013/0173970 A1 | 7/2013 | Kleveland et al. | |

* cited by examiner

METHOD FOR MANAGING A FAIL BIT LINE OF A MEMORY PLANE OF A NON VOLATILE MEMORY AND CORRESPONDING MEMORY DEVICE

This application claims priority to French Application No. 1561729 filed on Dec. 2, 2015, which application is hereby incorporated herein by reference.

TECHNICAL FIELD

Various embodiments of the invention and their implementation relate to non-volatile memories, and more particularly the management of at least one defective bit line of the memory plane of such a memory.

BACKGROUND

In operation, the memory plane of a non-volatile memory may be subject to short-circuits, for example between a bit line and the control gate of the memory cell connected to this bit line, owing to the breakdown of an insulator, for example an insulating spacer situated on the flanks of the control gate.

This may then result in defects in this bit line which is then considered as damaged or faulty, and whose content, in other words the contents of the memory cells connected to this bit line, is then considered as lost.

In other words, when the bits contained in these locations are read, these defective memory locations lead to erroneous logical values.

One conventional solution consists in using an error correction code (or ECC) in order to correct the erroneous logical value of a bit. More precisely, with an error correction code, if s control bits are added to b data bits r errors from amongst the b+s bits can be corrected.

Generally speaking, the error correction codes used in the field of memories allow only one error (r=1) to be corrected within the word of b+s bits.

However, the defective nature of a bit line will compromise the capacity for correction of the ECC mechanism because the error in a word due to one damaged bit from a defective bit line risks being added to another error in another bit of this word then leading to a double error in the word which is indeed detected but not corrected.

SUMMARY

According to one embodiment and its implementation, an automatic bit line redundancy mechanism is provided for a non-volatile memory operating during the normal operation of the memory and avoiding a loss of the information stored in the memory cells of a bit line detected as being defective, and not compromising the correction capacity of a correction mechanism of the ECC type.

According to one aspect, a method is provided for managing the operation of a non-volatile memory equipped with a system for correction of a single error and for detection of a double error.

Such a system is generally denoted by those skilled in the art using the acronym SEC-DED (Single Error Correction-Double Error Detection).

The method according to this aspect comprises, in the case of the detection of a defective bit line of the memory plane, the assignment of a redundant bit line and the copying, into the memory cells of the redundant bit line, of the values of the bits of the memory cells of the defective bit line, inverted in the case of the detection of double errors by the system, or corrected by the system in the presence of single errors.

It goes without saying that, if no error is detected by the system, then the value of the bit of the memory cell in question of the defective bit line is copied as is into the homologous memory cell of the redundant bit line.

If the value of the bit of the memory cell in question of the defective bit line turns out to be a single error in the word analyzed by the system, then it is corrected by the system and this corrected value is copied into the homologous memory cell of the redundant bit line.

If, on the other hand, the analysis of the word containing the value of the bit of the memory cell in question of the defective bit line leads to the detection of a double error, then one of these errors is necessarily the value of the bit of the defective memory cell belonging to the defective bit line, because, prior to the detection of the defective bit line, the system had not detected a double error (which, in this case, would have triggered an alarm signal).

For this reason, by inverting the value of the bit of the defective memory cell (since the position of this bit in the word being analyzed is known), not only is this error corrected which allows this inverted value to be copied into the homologous memory cell of the redundant bit line, but this inverted value, and hence this correction allows the situation to be reduced to a single error in the word under analysis, which will be able to be corrected by the system.

Thus, not only has the correction capacity of the SEC-DED system not been compromised, but the SEC-DED system has been endowed with a capacity for correction of a double error (DEC: Double Error Correction).

In other words, according to one embodiment, the copying comprises a word-by-word read of the memory plane, the words being homologous words respectively belonging to the rows of the memory plane, each word being formed from several memory cells including that belonging to the defective bit line and containing data bits, control bits and a global parity. For each current word, the copying comprises an analysis of the current word by the system and, in the case of the detection of a double error, an inversion of the logical value of the bit stored in the memory cell belonging to the defective bit line and the copying of this inverted value into the corresponding memory cell of the redundant bit line.

Whereas in theory it would suffice to copy this inverted value into the corresponding memory cell of the redundant bit line, it is preferable, in practice, to re-apply the ECC in order to correct the other error in the current word.

Thus, according to one embodiment, prior to the copying of the inverted value, the formation is furthermore provided of a new word comprising the bits of the current word and the inverted bit, together with a new analysis of the new word by the SEC-DED system.

As previously indicated, in the absence of an error detected by the SEC-DED system, or in the presence of a single error detected and corrected by the SEC-DED system, the copying operation comprises the copying into the corresponding memory cell of the redundant bit line of the value of the bit contained in the output word delivered by the system and associated with the memory cell of the defective bit line.

According to another aspect, a memory device is provided, comprising a non-volatile memory comprising a memory plane having rows and lines of bits, a bit line redundancy mechanism comprising at least one non-volatile register and at least one redundant bit line, a system for correction of a single error and for detection of a double error (SEC-DED system), and the controller configured for, in the case of the detection of a defective bit line of the memory plane, copying into the memory cells of the redundant bit line the values of the bits of the memory cells of the defective bit line, inverted in the case of the detection of double errors by the SEC-DED system, or corrected by the SEC-DED system in the presence of single errors.

According to one embodiment, the controller comprises a read circuit configured for carrying out a read of the memory plane, word by word, the words being homologous words respectively belonging to the rows of the memory plane, each word being formed from several memory cells including that belonging to the defective bit line and containing data bits, control bits and a global parity bit. The SEC-DED system is configured for carrying out, for each current word, an analysis of the current word, and the controller further comprises a module configured for, in the case of the detection of a double error, inverting the logical value of the bit stored in the memory cell belonging to the defective bit line, the controller then being configured for carrying out the copying of this inverted value into the corresponding memory cell of the redundant bit line.

According to one embodiment, the module is furthermore configured for, prior to the copying, delivering the inverted value to the system in such a manner as to form a new word comprising the bits of the current word and the inverted bit, and the SEC-DED system is configured for carrying out a new analysis of the new word.

According to one embodiment, in the absence of an error detected by the SEC-DED system or in the presence of a single error detected and corrected by the SEC-DED system, the controller is configured for copying into the corresponding memory cell of the redundant bit line the value of the bit contained in the output word delivered by the SEC-DED system and associated with the memory cell of the defective bit line.

The method and the device according to these aspects are advantageously applicable to any type of non-volatile memory, such as for example, a memory of the electrically-erasable programmable ROM memory (EEPROM) type, or else a memory whose memory cells comprise a floating gate and a shared gate, namely a control gate and an erase gate, or else a non-volatile memory of the type of that described in the French Patent application n°15 54163, which is incorporated herein by reference. It is understood that these examples are not limiting.

BRIEF DESCRIPTION OF THE DRAWINGS

Other advantages and features of the invention will become apparent upon examining the detailed description of non-limiting embodiments and their implementations and from the appended drawings in which.

DETAILED DESCRIPTION OF ILLUSTRATIVE EMBODIMENTS

Figure 1:
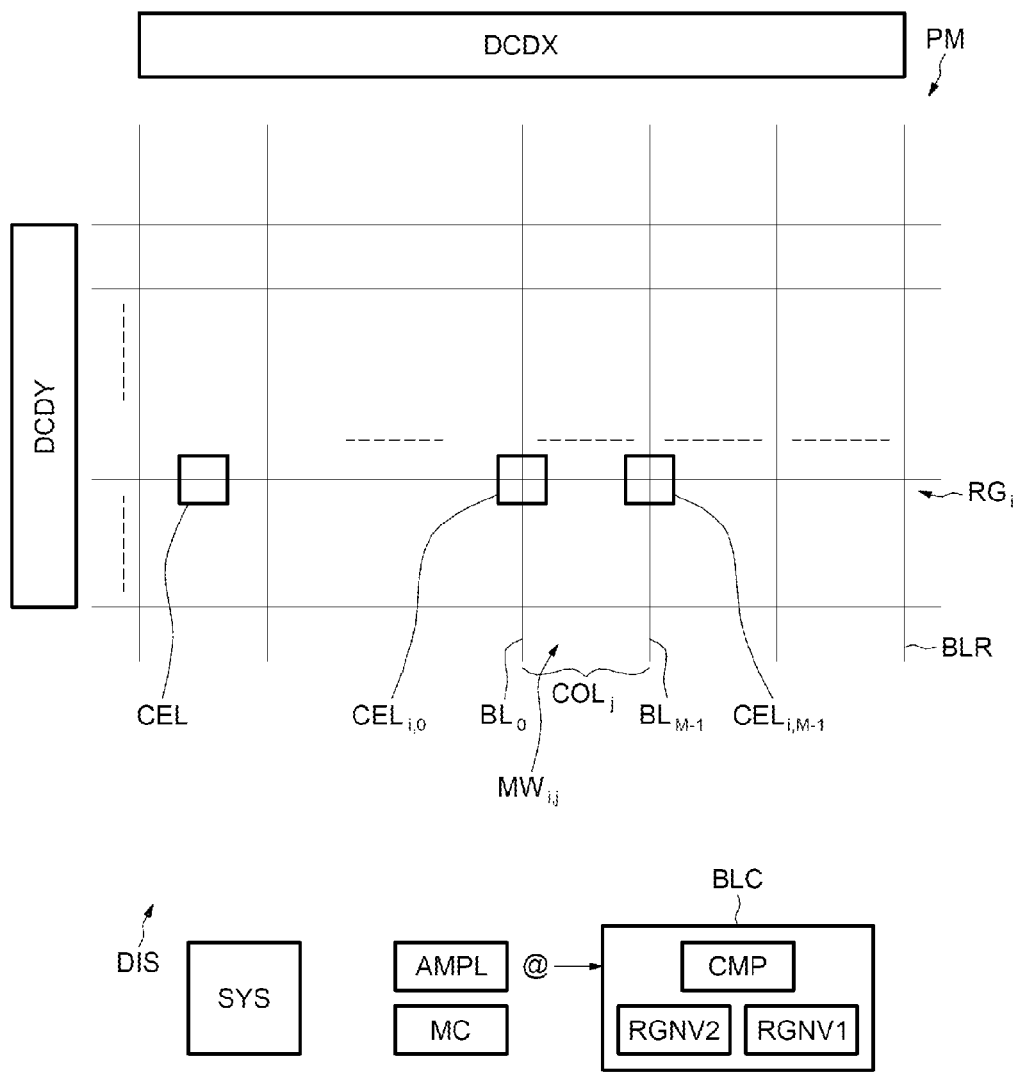
FIGS. 1 to 4 illustrate various embodiments of the invention and their implementation.

In FIG. 1, the reference DIS denotes a memory device comprising a memory plane PM of a non-volatile memory, conventionally comprising rows or word-lines $RG_i$ and bit lines BL.

Memory cells CEL are conventionally connected to the word-lines and to the bit lines.

The bit lines are grouped in columns $COL_j$ here comprising M bit lines $BL_0$-$BL_{M-1}$.

M may for example be equal to 39, thus corresponding to words of 32 useful bits (4 bytes) accompanied by 6 control bits and by a global parity bit. As will be seen in more detail hereinafter, the control bits and the global parity bit are used for the correction and the detection of errors in the word.

The memory cells of the same word-line connected to the M bit lines of a column $COL_j$ therefore form a memory word $MW_{i,j}$ allowing M bits to be stored.

Each memory cell $CEL_{i,j}$ conventionally comprises for example a state transistor with floating gate and an access transistor of the MOS type.

The memory device DIS also conventionally comprises row and column decoders DCDY and DCDX, together with read circuitry of conventional structure and notably comprising read amplifiers AMPL.

In FIG. 1, the read amplifiers AMPL have been shown for the sake of simplification of the figure underneath the memory plane PM with the column decoder DCDX shown on top of the memory plane, whereas, in practice, the column decoder DCDX is of course disposed between the memory plane and the read amplifiers AMPL.

Other conventional and known circuits and structures of a memory device, not useful for the understanding of the invention, are not shown here for the sake of simplification.

The memory plane PM also comprises at least one redundant bit line BLR (only one redundant bit line is shown here for the sake of simplification).

Indeed, it is possible, during the operation of the memory, for a bit line BL of the memory plane to become defective subsequent to short-circuits occurring for example between a bit line and the control gate of the memory cell connected to this bit line owing to the breakdown of an insulator, for example an insulating spacer situated on the flanks of the control gate.

Damage to a bit line may be the consequence for example of damage to a memory page during a phase for erasing or for programming bits.

The detection and the identification of a defective bit line is for example carried out via a page read without row selection, the defective bit line then being the bit line that exhibits a leakage current.

In order to manage the defective bit line or lines that could be detected within the memory plane PM, the memory device DIS also comprises a bit line redundancy mechanism here comprising a block BLC including a first non-volatile register RGNV1 and a second non-volatile register RGNV2.

The register RGNV1 is designed to store as many bits as there are redundant bit lines, each bit being representative of the enabling or not of the redundancy ("redundancy enabled") relating to the corresponding redundant bit line, whereas the register RGNV2 is designed to store the address of any bit line detected as being defective, it being clearly understood that the register RGNV2 cannot contain more addresses of bit lines detected as being defective than there are redundant bit lines.

Although the two registers RGNV1 and RGNV2 have been shown in this example as two separate non-volatile registers, these two registers could be functionally combined within one and the same non-volatile register.

Aside from these non-volatile registers, the line redundancy mechanism comprises one or more additional read amplifiers (not shown here) respectively dedicated to the redundant bit line or lines.

In practice, when the redundancy is enabled, the redundancy mechanism is configured for, when an address @ of a bit line is received, verifying whether this address corresponds to an address stored in the register RGNV2. This is carried out in a comparator CMP, for example an EXCLUSIVE NOR (XNOR) gate. If such is the case, then, since the redundant bit line in question is, in any case, systematically addressed in conjunction with the defective bit line of the memory plane, during the read operation, the data value delivered by the additional read amplifier connected to this redundant bit line will be selected instead of selecting the data value delivered by the read amplifier connected to the defective bit line.

However, when a defective bit line is detected, its content should be copied into the redundant bit line.

This will be explained in more detail hereinafter.

The device also comprises a system SYS configured for correcting a single error or else detecting a double error in a word. Such a system is conventional and known per se.

More precisely, such a system receives a digital word comprising data bits, control bits and a global parity bit. The system SYS then, based on the data bits and on all of the control bits, determines syndrome bits which allow the error in the word to be detected and to be localized. More precisely, the determination of the syndrome bits is carried out by recalculating the control bits using the data bits of the received word, and by applying an EXCLUSIVE OR function to the recalculated control bits and to the received control bits.

Similarly, the system SYS is configured for performing a check of the global parity by recalculating the global parity bit from the bits and by comparing this recalculated global parity bit with the global parity bit received.

From here on, several cases are possible.

If the parity is good and if all the syndrome bits are at zero, then this means that there is no error in the received word and hence no correction is applied by the system SYS.

If the parity is good but at least one syndrome bit is non-zero, then this means that there is a double error in the received word.

It will be seen hereinafter how this double error is handled with regard to the defective bit line.

If the parity is not good and if all the syndrome bits are at zero, then the word has a single error which is in fact in the parity bit, and this error can be corrected by the ECC mechanism implemented within the system SYS.

Finally, if the parity is not good and if at least one syndrome bit is non-zero, then the word contains a single error which, here again, will be able to be corrected by the ECC mechanism.

Aside from the circuits that have just been described, the device DIS comprises a controller MC, which may be formed, at least in part, by a state machine, and whose function will be considered in more detail hereinafter, notably during the copying of the content of a defective bit line into the redundant bit line.

Figure 2:
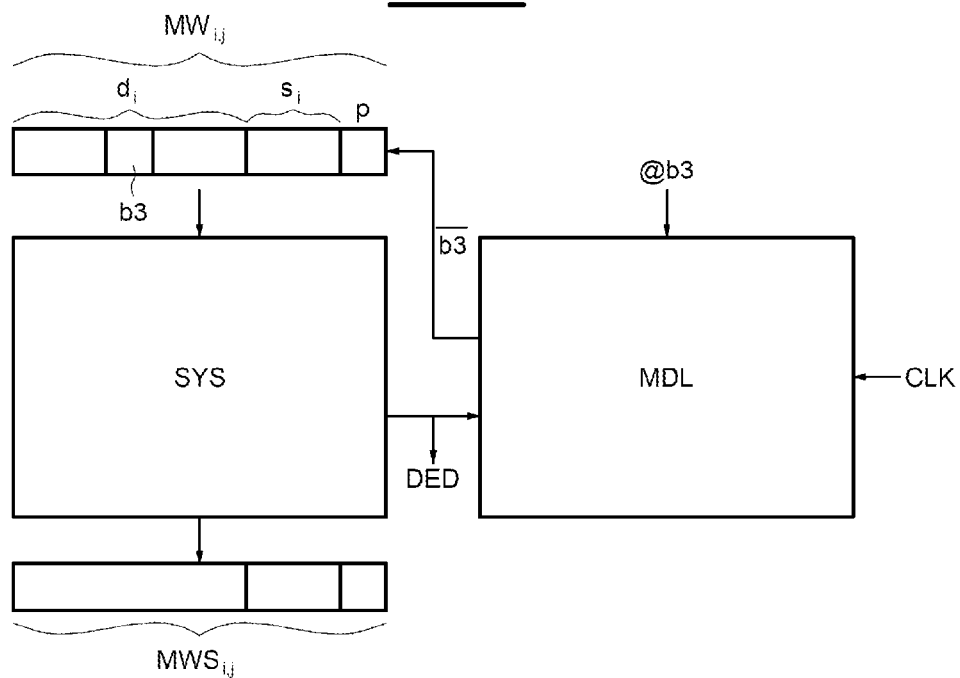

Before detailing one embodiment of the method for copying the content of a defective line into a redundant line, reference will more particularly be made to FIG. 2 in which a module MDL is shown that forms part of the controller MC, and which is only active when copying the content of a defective bit line.

This module MDL is for example a logic circuit having a sequential operation timed by the rising edges of a clock signal CLK.

The system SYS for correction of a single error and for detection of a double error (SEC-DED system) receives a current word $MW_{i,j}$ which here comprises $d_i$ data bits, $s_i$ control bits and 1 global parity bit p.

The system SYS delivers an output word $MWS_{i,j}$ which, as will be seen in more detail hereinafter, may be, depending on the case, either the current input word, or a corrected word, or a completely erroneous word.

It goes without saying that this output word also contains $d_i$ data bits, $s_i$ control bits and 1 global parity bit p.

When the system SYS detects a double error in the current input word $MW_{i,j}$, it delivers a DED detection signal and this signal is delivered to the module MDL.

It is also assumed that the current word $MW_{i,j}$ contains one bit, here the bit b3 which is a data bit, stored in a memory cell of a bit line which has just been detected as being defective.

The module MDL, which furthermore knows the address of the bit b3, then inverts the value of this bit in such a manner as to form a new word in which the bit b3 is replaced by the bit $\overline{b3}$.

Figure 3:
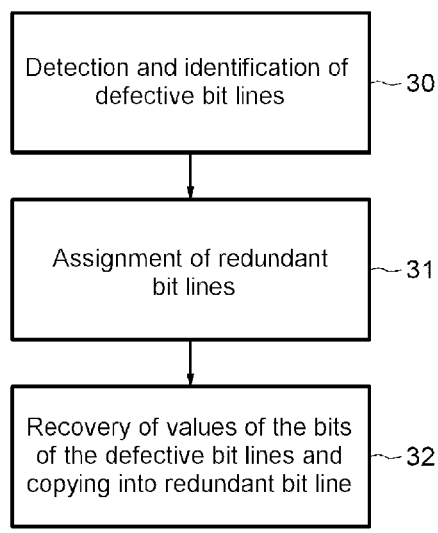
Figure 4:
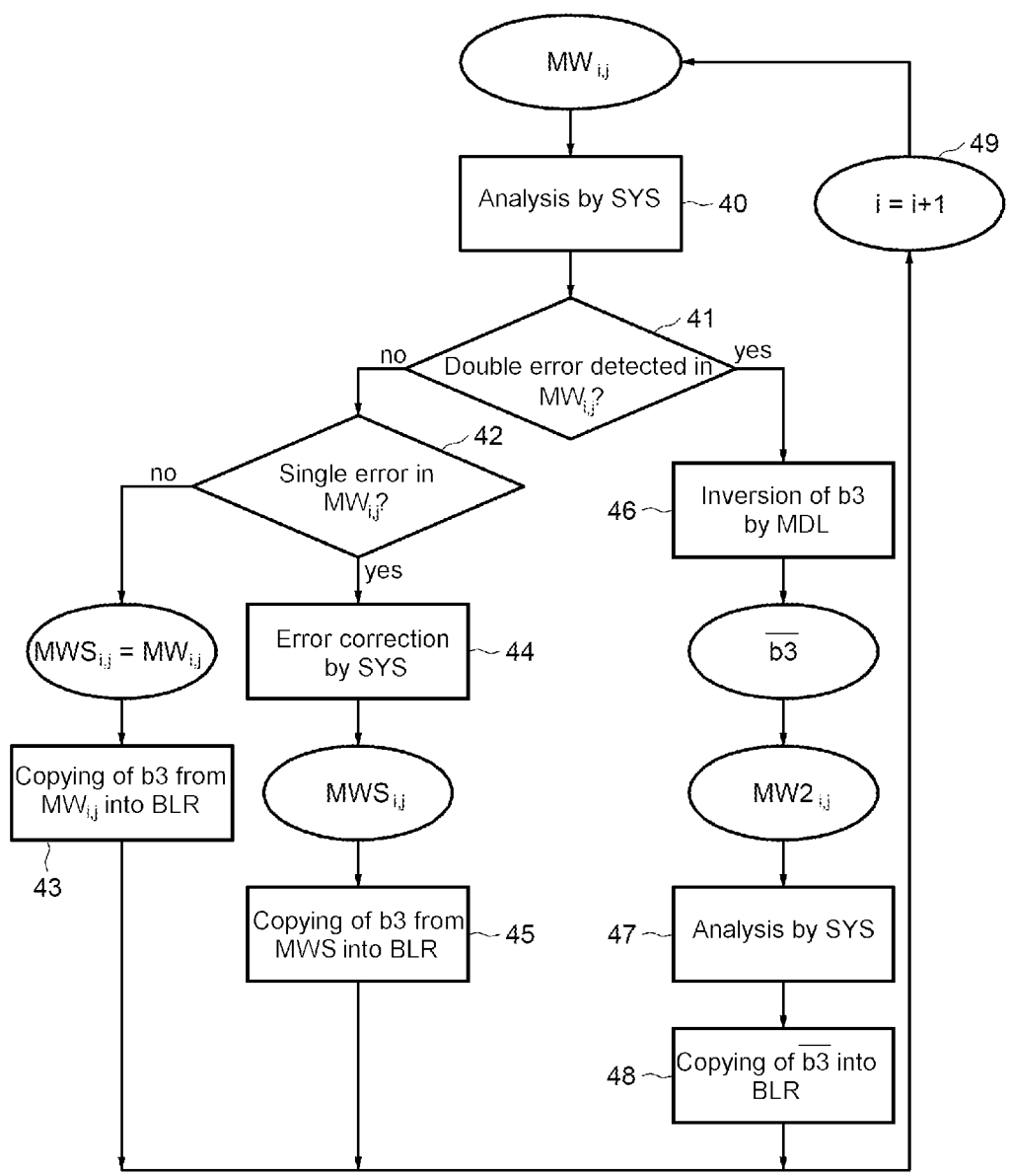

Reference is now more particularly made to FIGS. 3 and 4 in order to illustrate one mode of operation of the memory device which has just been described.

In a first step 30 (FIG. 3) a defective bit line is detected and identified as is for example explained hereinbefore.

Then, in a step 31, the redundant bit line BLR is assigned to this defective bit line. The address @ of the defective bit line is stored in the register RGNV2 and the redundancy bit stored in the register RGNV1 takes the value 1 for example (redundancy enabled).

Then, in the step 32, the values of the bits of the defective bit line are recovered and they are copied into the redundant bit after, as will be seen in more detail, a possible inversion or correction.

This is described in more detail in FIG. 4.

In order to carry out the copying of the content of a defective bit line into the redundant bit line, in other words for performing the transfer of the values of the bits contained in the memory cells of the defective bit line into the homologous memory cells of the redundant line, the controller enables the read circuit so as to perform a word-by-word read of the memory plane.

Each current word $MW_{i,j}$ belongs to the same column of the memory plane and is a word formed from several memory cells including those belonging to the defective bit line.

It is assumed here, with reference to FIG. 2, that the memory cell belonging to the defective bit line is that containing the bit b3 of each current word.

In the step 40, the system SYS carries out an analysis of the word $MW_{i,j}$.

If, in the step 41, a double error is not detected in the current word $MW_{i,j}$, and if, in the step 42, there is also no single error in this current word, then the output word $MWS_{i,j}$ delivered by the system SYS is equal to the current input word $MW_{i,j}$ and, in this case, the value of the bit b3 of the current word $MW_{i,j}$ is copied into the corresponding memory cell of the redundant line BLR.

The copying of a value of a bit into the corresponding memory cell of the redundant bit line is achieved by a conventional write operation command from the controller MC.

If, on the other hand, a single error is detected in the current word $MW_{i,j}$, then this single error is corrected by the ECC mechanism of the system SYS (step 44) and, in the step 45, the bit b3 of the corrected output word $MWS_{i,j}$ is then copied into the corresponding memory cell of the redundant line BLR.

In the case where a double error is detected in the current word $MW_{i,j}$ (DED signal at 1 for example), then the module MDL applies an inversion 46 of the value of the bit b3 contained in the memory cell belonging to the defective bit line.

At this stage, it would be perfectly possible to already now copy this new bit b3 into the corresponding memory cell in the redundant bit line.

However, it is preferable to form a new word $MW_{i,j}$ which comprises all the bits of the current word $MW_{i,j}$ with the exception of the bit b3 which is replaced by the bit ($\overline{b3}$).

This new word $MW_{i,j}$ is subsequently analyzed (step 47) by the system SYS which corrects the second error in this current word. This is possible since this second error has become a single error by reason of the inversion of the bit b3.

In the step 48, the bit b3 is subsequently copied into the redundant bit line.

All these steps for the current word belonging to the next row are then iterated (i=i+1: step 49).

It should also be noted that the present invention is compatible with the invention described in the co-pending U.S. patent application filed the same day as the present U.S. patent application. The compatible invention is entitled "Method for Managing a Fail Row of the Memory Plane of a Non Volatile Memory and Corresponding Memory Device."

What is claimed is:

1. A method for managing the operation of a non-volatile memory equipped with a single error correction and double error detection (SEC-DED) system, the method comprising:
   detecting, by a controller, a defective bit line of a memory plane of the non-volatile memory, the defective bit line comprising a plurality of memory cells, each memory cell storing a bit of information;
   assigning, by the controller, a redundant bit line that corresponds with the defective bit line; and
   writing, by the controller, values of the bits of the memory cells of the defective bit line into corresponding memory cells of the redundant bit line, wherein the writing values comprises:
      analyzing, with the SEC-DED system, a given word having a given bit coupled to the defective bit line to generate a given number of errors associated with the given word,
      when the given number of errors is equal to 2, write an inverted value of the given bit into the corresponding memory cell of the redundant bit line, and
      when the given number of errors is equal to 1, write a corrected value of the given bit into the corresponding memory cell of the redundant bit line, wherein the corrected value is provided by the SEC-DED system, wherein the writing comprises a word-by-word read of words of the memory plane, and wherein the words are homologous words respectively belonging to different rows of the memory plane and to the same column of the memory plane, each word being formed of several memory cells including a memory cell belonging to the defective bit line and containing data bits, control bits and a global parity bit.

2. The method according to claim 1, further comprising reading a word from the memory plane, wherein the word is an homologous word that belongs to multiple rows of the memory plane and a single column of the memory plane.

3. The method according to claim 1, wherein each word of the memory plane contains data bits, control bits and a global parity bit.

4. The method according to claim 1, wherein the writing further comprises analyzing a current word by the system, and upon detecting a double error, inverting a logical value of a bit stored in the memory cell belonging to the defective bit line and writing the inverted logic value into a corresponding memory cell of the redundant bit line.

5. The method according to claim 4, wherein the writing further comprises, prior to writing the inverted logic value, forming a new word comprising bits of the current word and the bit with the inverted logic value, and performing a new analysis of the new word by the system.

6. The method according to claim 1, wherein no error is detected by the system or when an error is detected and corrected by the system, the writing comprising copying a value of a bit contained in an output word of the defective bit line into a memory cell of the redundant bit line that corresponds to the bit contained in the output word.

7. The method according to claim 1, wherein the writing values comprises: each time the given number of errors is equal to 2, write an inverted value of the given bit into the corresponding memory cell of the redundant bit line.

8. A method for managing the operation of a non-volatile memory equipped with a system for correcting a single error and for detecting a double error, the method comprising:
   detecting, by a controller, a defective bit line of a memory plane of the non-volatile memory, the defective bit line comprising a plurality of memory cells, each memory cell storing a bit of information;
   assigning, by the controller, a redundant bit line that corresponds with the defective bit line;
   determining, by the controller, that a given word having a given memory cell coupled to the defective bit line has a double error;
   inverting, by the controller, a logical value of the given memory cell; and
   writing, by the controller, the logical inverted value of the given memory cell into a corresponding memory cell of the redundant bit line, wherein the writing comprises a word-by-word read of words of the memory plane, the words being homologous words respectively belonging to different rows of the memory plane and to the same column of the memory plane, each word being formed of a plurality of memory cells including a memory cell belonging to the defective bit line, each word containing data bits, control bits and a global parity bit.

9. The method according to claim 8, further comprising reading a word from the memory plane, wherein the word is an homologous word that belongs to multiple rows of the memory plane and a single column of the memory plane.

10. The method according to claim 9, wherein the word includes a memory cell belonging to the defective bit line.

11. The method according to claim 9, wherein the word contains data bits, control bits and a global parity bit.

12. The method according to claim 8, further comprising, prior to the writing the inverted value, forming a new word comprising bits of the given word and a new bit with the inverted value of the given bit, and performing an analysis of the new word by the system.

13. A memory device, comprising:
   a non-volatile memory comprising a memory plane having rows and columns of memory cells, each memory cell storing a bit;
   a bit line redundancy mechanism comprising a non-volatile register and a redundant bit line, the redundant bit line comprising a plurality of memory cells;
   a single error correction and double error detection (SEC-DED) system; and a controller configured to, when a defective bit line of the memory plane is detected,
   analyze a given word having a given bit coupled to the defective bit line with the SEC-DED system to produce a given number of errors,
   when the given number of errors is equal to 2, write an inverted value of the given bit into a corresponding memory cell of the redundant bit line, and
   when the given number of errors is equal to 1, write a corrected value of the given bit into the corresponding memory cell of the redundant bit line, wherein the corrected value is provided by the SEC-DED system, wherein the controller comprises a read circuit configured to cause words of the memory plane to be read out word by word, the words being homologous words respectively belonging to different rows of the memory plane and the same column of the memory plane, each word being formed from several memory cells including a memory cell belonging to the defective bit line, each word containing data bits, control bits and a global parity bit.

14. The memory device according to claim 13, wherein, the system is configured to carry out, for each current word, an analysis of a current word by the system, and wherein the controller further comprises a module configured to, when a double error is detected, invert a logical value of the bit stored in the memory cell belonging to the defective bit line, the controller then being configured to cause the inverted logical value to be copied into a corresponding memory cell of the redundant bit line.

15. The memory device according to claim 14, wherein the module is further configured to deliver the inverted logical value to the system so as to form a new word comprising the bits of the current word and the bit with the inverted logical value, and wherein the system is configured to carry out a new analysis of the new word.

16. The memory device according to claim 13, wherein, in the absence of an error detected by the system or in the presence of a single error detected and corrected by the system, the controller is configured to copy into a corresponding memory cell of the redundant bit line the value of the bit contained in an output word delivered by the system and associated with a memory cell of the defective bit line.

* * * * *